United States Patent
Kikuta

(10) Patent No.: US 10,725,489 B2
(45) Date of Patent: Jul. 28, 2020

(54) SEMICONDUCTOR DEVICE

(71) Applicant: LAPIS SEMICONDUCTOR CO., LTD., Kanagawa (JP)

(72) Inventor: Hiroyuki Kikuta, Kanagawa (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 0 days.

(21) Appl. No.: 15/406,024

(22) Filed: Jan. 13, 2017

(65) Prior Publication Data

US 2017/0131731 A1    May 11, 2017

Related U.S. Application Data

(63) Continuation of application No. 15/077,394, filed on Mar. 22, 2016, now Pat. No. 9,582,019.

(30) Foreign Application Priority Data

Mar. 25, 2015    (JP) .................................. 2015-063255

(51) Int. Cl.
*G05F 1/625* (2006.01)
*H03M 1/12* (2006.01)
*H03M 1/80* (2006.01)

(52) U.S. Cl.
CPC .............. *G05F 1/625* (2013.01); *H03M 1/12* (2013.01); *H03M 1/808* (2013.01)

(58) Field of Classification Search
CPC ............ H03M 1/12; H03M 1/14; H03M 1/16; H03M 1/18; H03M 1/20; H03M 1/22;

(Continued)

(56) References Cited

U.S. PATENT DOCUMENTS 5,680,132 A    10/1997   Kobatake
6,963,298 B2 *  11/2005   Otsuka .................. H03M 1/363
                                              341/155

(Continued)

FOREIGN PATENT DOCUMENTS

JP    H08167847 A    6/1996
JP    H10173452 A    6/1998

(Continued)

OTHER PUBLICATIONS

Japanese Office Action dated Oct. 9, 2018 with English translation.

*Primary Examiner* — Patrick C Chen
(74) *Attorney, Agent, or Firm* — Volentine, Whitt & Francos, PLLC

(57) ABSTRACT

A semiconductor device including a resistance section that includes a first terminal and a second terminal disposed in contact with an outer periphery, and a serial resistance section in which plural resistance elements are connected in series, wherein one end of the serial resistance section is connected to the first terminal, and another end of the serial resistance section is connected to the second terminal; and a current adjustment section that includes a current source that supplies current to the serial resistance section, and disposed adjacent to the resistance section such that a distance between the first terminal and the current adjustment section along the outer periphery of the resistance section and a distance between the second terminal and the current adjustment section along the outer periphery of the resistance section are equal.

7 Claims, 7 Drawing Sheets

(58) Field of Classification Search
CPC .......... H03M 1/34; H03M 1/36; H03M 1/361;
H03M 1/362; H03M 1/363; H03M 1/365
USPC ........................................................ 327/306
See application file for complete search history.

(56) References Cited

U.S. PATENT DOCUMENTS

| | | | |
|---|---|---|---|
| 7,095,352 B2 | 8/2006 | Tani et al. | |
| 7,212,144 B1 | 5/2007 | Sutardja | |
| 7,279,960 B1 | 10/2007 | Lee | |
| 2009/0195282 A1* | 8/2009 | Tatsumi | H01L 27/0207 |
| | | | 327/175 |
| 2012/0161868 A1* | 6/2012 | Yayama | H03K 3/0231 |
| | | | 330/252 |
| 2013/0027121 A1* | 1/2013 | Yoon | G05F 1/56 |
| | | | 327/536 |

FOREIGN PATENT DOCUMENTS

| | | |
|---|---|---|
| JP | 2003045984 A | 2/2003 |
| JP | 2003-078415 A | 3/2003 |
| JP | 2010085319 A | 4/2010 |
| JP | 2014053570 A | 3/2014 |

* cited by examiner

SEMICONDUCTOR DEVICE

CROSS-REFERENCE TO RELATED APPLICATION

This application is a continuation application of application Ser. No. 15/077,394, filed on Mar. 22, 2016, now U.S. Pat. No. 9,582,019 issued on Mar. 28, 2017, which claims priority under 35 USC 119 from Japanese Patent Application No. 2015-063255, filed on Mar. 25, 2015, the disclosure of which is incorporated by reference herein.

BACKGROUND

Technical Field

The present disclosure relates to a semiconductor device.

Related Art

For example, in an analog-digital (AD) converter, a digital-analog (DA) converter, and the like, a resistance voltage dividing circuit including a serial resistance section in which plural resistance elements are connected in series, and a constant-current source which is connected to each of one end and the other end of the serial resistance section, is used (for example, see Japanese Patent Application Laid-Open (JP-A) No. 2003-078415).

FIG. 8 illustrates an example of a resistance voltage dividing circuit 100. The resistance voltage dividing circuit 100 includes a serial resistance section 110 in which resistance elements R1 to R12 are connected in series, and constant-current sources I1 and I2. The constant-current source I1 is a constant-current source of a so-called discharge type which discharges a bias current Ibias1. The constant-current source I1 supplies a power-supply voltage VCC from one end thereof, and the other end thereof is connected to one end of the serial resistance section 110. Further, the constant-current source I2 is a constant-current source of a so-called sink type which sinks a bias current Ibias2, and has one end being connected to the other end of the serial resistance section 110 and the other end being grounded. Further, a voltage Vin is input to a connection point between the resistance element R6 and the resistance element R7.

In the resistance voltage dividing circuit 100 configured in this manner, a divided voltage is output from each connection point among the resistance elements R1 to R12. In a case in which each resistance value of the resistance elements R1 to R12 is set to r, for example, a voltage of Vin+Ibias1×r×n (n=5 to 1) is output from each connection point among the resistance element R1 to R6. Further, a voltage of Vin−Ibias2×r×n (n=1 to 5) is output from each connection point among the resistance element R7 to R12. Further, the voltage Vin is output from the connection point between the resistance element R6 and the resistance element R7.

In a semiconductor device including the resistance voltage dividing circuit 100 described above, when operating the device, it is important for the bias current Ibias1 discharged by the constant-current source I1 and the bias current Ibias2 sunk by the constant-current source I2 to be equal.

For example, in a case in which the bias current Ibias1 and the bias current Ibias2 are different, current flows out to an input terminal side to which the voltage Vin is input, and thus, is such case, the device may not properly operate.

Further, for example, in a case in which the bias current Ibias1 and the bias current Ibias2 are different, a degree of rise in potential from the voltage Vin in each connection point among the resistance element R1 to R6 and a degree of drop in potential from the voltage Vin in each connection point among the resistance element R7 to the resistance element R12 becomes different from each other, and thus, is such case, the device may not properly operate.

However, in JP-A No. 2003-078415 described above, there is no description regarding a layout of the elements configuring the resistance voltage dividing circuit 100 that allows the bias current Ibias1 and the bias current Ibias2 to be equal.

SUMMARY

The present disclosure provides a semiconductor device that may efficiently equalizing current flowing in one end and current flowing in the other end of a serial resistance section in which plural resistance elements are connected in series.

A first aspect of the present disclosure is a semiconductor device including: a resistance section that includes a first terminal and a second terminal disposed in contact with an outer periphery, and a serial resistance section in which plural resistance elements are connected in series, wherein one end of the serial resistance section is connected to the first terminal, and another end of the serial resistance section is connected to the second terminal; and a current adjustment section that includes a current source that supplies current to the serial resistance section, and disposed adjacent to the resistance section such that a distance between the first terminal and the current adjustment section along the outer periphery of the resistance section and a distance between the second terminal and the current adjustment section along the outer periphery of the resistance section are equal.

According to the above aspect, the present disclosure may efficiently equalize the current flowing in one end and the current flowing in the other end of the serial resistance section in which the plural resistance elements are connected in series.

BRIEF DESCRIPTION OF THE DRAWINGS

Exemplary embodiments will be described in detail based on the following figures, wherein.

DETAILED DESCRIPTION

Hereinafter, exemplary embodiments of the present disclosure will be described in detail with reference to the drawings.

First Exemplary Embodiment

Figure 1:
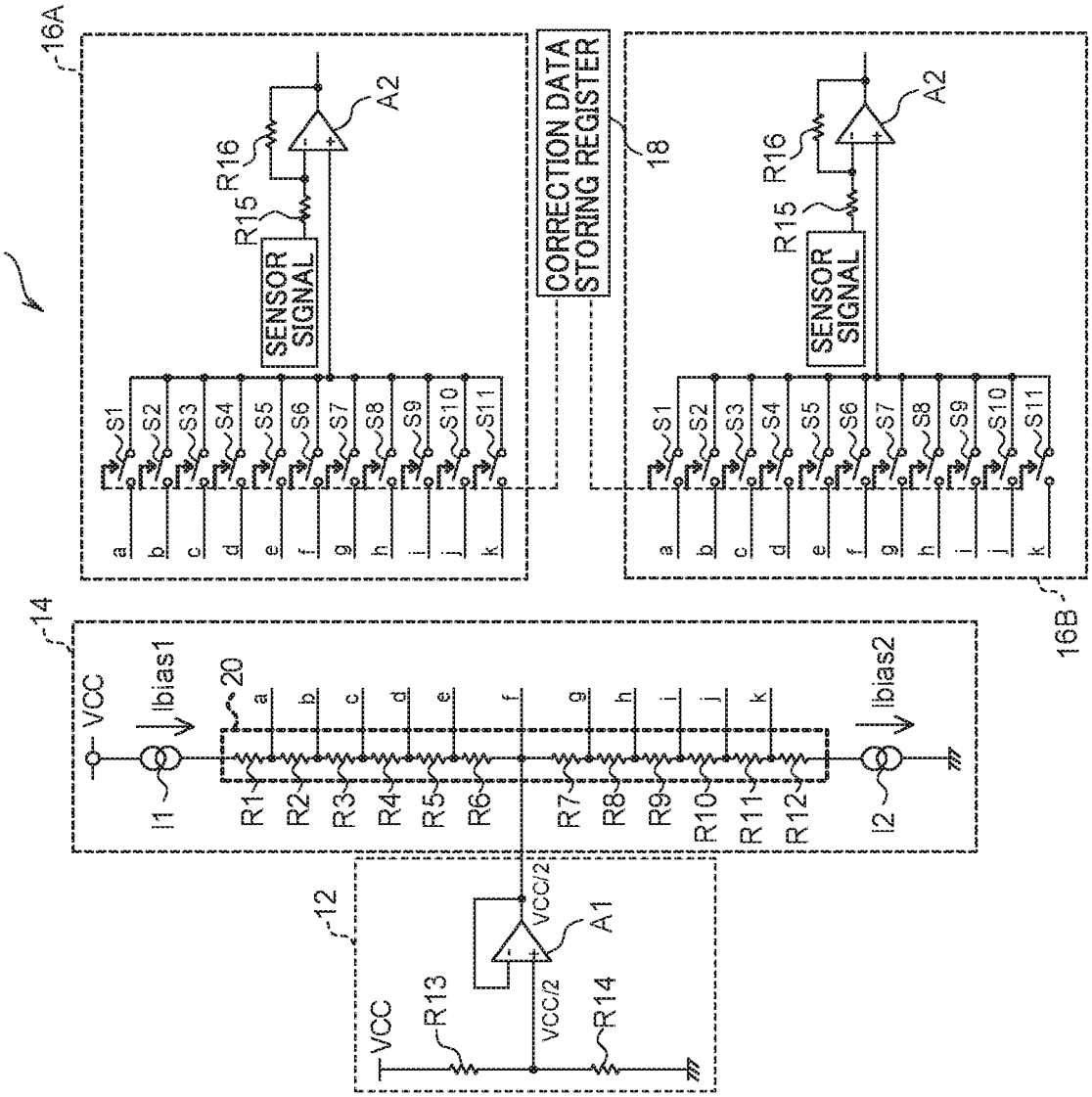
FIG. 1 is a circuit diagram illustrating a main configuration of a circuit provided in a semiconductor device according to a first exemplary embodiment.

First, a description will be given regarding a circuit configuration of a semiconductor device 10 according to a first exemplary embodiment with reference to FIG. 1. As illustrated in FIG. 1, the semiconductor device 10 according to the first exemplary embodiment includes a ratiometric generation circuit 12, a ratiometric correction circuit 14, plural (two in the first exemplary embodiment) correction target circuits 16A and 16B, and a correction data storing register 18. Hereinafter, an alphabet denoted at the end of reference numeral will be omitted in a case in which it is unnecessary to distinguish the correction target circuits 16A and 16B.

The ratiometric generation circuit 12 includes resistance elements R13 and R14, and an operational amplifier A1. The resistance elements R13 and R14 are connected in series, and a power-supply voltage VCC is supplied from one end thereof, and the other end thereof is grounded. A connection point between the resistance element R13 and the resistance element R14 is connected to a non-inverting input terminal of the operational amplifier A1. An output terminal of the operational amplifier A1 is connected to an inverting input terminal of the operational amplifier A1, and is connected to the ratiometric correction circuit 14. Namely, a voltage (here, VCC/2) divided by the resistance elements R13 and R14 is output from the output terminal of the operational amplifier A1.

The ratiometric correction circuit 14 includes a serial resistance section 20, which includes resistance elements R1 to R12 connected in series, and constant-current sources I1 and I2. The constant-current source I1 is a constant-current source of a so-called discharge type which discharges a bias current Ibias1. The constant-current source I1 supplies the power-supply voltage VCC from one end thereof, and the other end thereof is connected to one end of the serial resistance section 20. Further, the constant-current source I2 is a constant-current source of a so-called sink type which sinks a bias current Ibias2, and has one end being connected to the other end of the serial resistance section 20 and the other end being grounded. Further, the voltage output from the ratiometric generation circuit 12 is input to a connection point f between the resistance element R6 and the resistance element R7. Further, respective connection points a to k among the resistance elements R1 to R12 are connected respectively to correction target circuits 16A and 16B. Note that FIG. 1 does not illustrate a wiring between the ratiometric correction circuit 14 and the correction target circuit 16 in order to avoid the intricacy, but a to k of the ratiometric correction circuit 14 and a to k of the correction target circuit 16 are connected with one-to-one correspondence.

Namely, the voltage divided by the respective connection points a to k among the resistance elements R1 to R12 is output from the ratiometric correction circuit 14. In a case in which each resistance value of the resistance elements R1 to R12 is set to r, for example, a voltage of VCC/2+Ibias1×r×n (n=5 to 1) is output from the respective connection points a to e among the resistance element R1 to R6. Further, a voltage of VCC/2−Ibias2×r×n (n=1 to 5) is output from the respective connection points g to k among the resistance element R7 to R12. Further, the voltage of VCC/2 is output from the connection point f between the resistance element R6 and the resistance element R7.

The correction target circuit 16 includes switches S1 to S11, resistance elements R15 and R16, and an operational amplifier A2. The respective connection points a to k among the resistance elements R1 to R12 of the ratiometric correction circuit 14 are connected to a non-inverting input terminal of the operational amplifier A2, via the respective corresponding switches S1 to S11. An output signal (hereinafter, referred to as a "sensor signal") from a sensor, for example, an acceleration sensor, a gyro sensor, or the like, which is driven by the power-supply voltage VCC, is input to an inverting input terminal of the operational amplifier A2 via the resistance element R15. An output terminal of the operational amplifier A2 is connected to the inverting input terminal of the operational amplifier A2 via the feedback resistance element R16.

The correction data storing register 18 includes storage area for each correction target circuit 16 individually, and outputs a digital signal according to a value stored in the storage area. Then, each ON/OFF state of the switches S1 to S11 is changed based on the digital signal output from the correction data storing register 18. The switches S1 to S11 are set such that any one switch thereof is set to the ON state, and the other switches are set to the OFF states. Then, the voltage output from the connection points a to k connected to any one of the switches S1 to S11, which has been set to the ON state, is input to the non-inverting input terminal of the operational amplifier A2.

Next, a description will be given regarding a circuit configuration of the constant-current sources I1 and I2 as examples of a current adjustment section with reference to FIG. 2. Hereinafter, an N-channel MOS field-effect transistor will be referred to as an NMOS transistor for convenience of description. Further, a P-channel MOS field-effect transistor will be referred to as a PMOS transistor for convenience of description.

Figure 2:
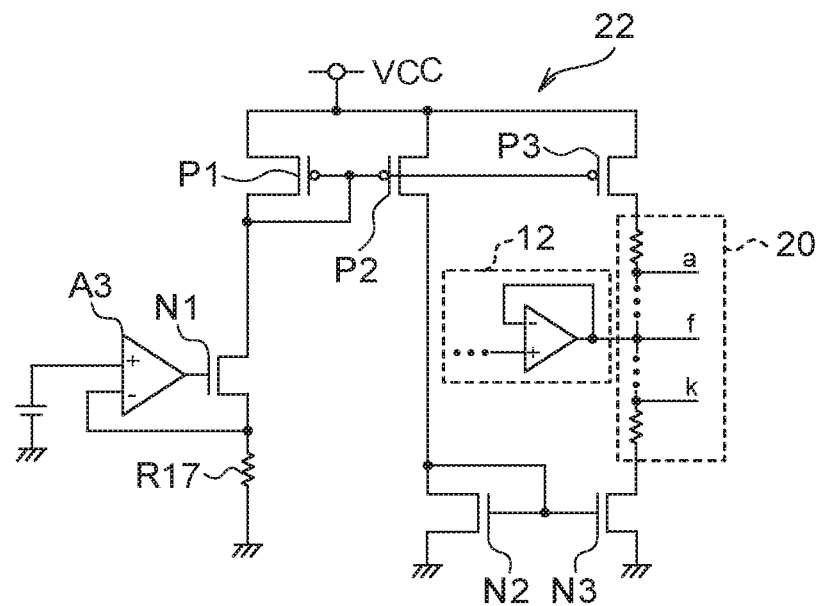
FIG. 2 is a circuit diagram illustrating a main configuration of a circuit of a constant-current source according to each exemplary embodiment.

As illustrated in FIG. 2, a current adjustment section 22 includes an operational amplifier A3, a resistance element R17, NMOS transistors N1 to N3, and PMOS transistors P1 to P3. A non-inverting input terminal of the operational amplifier A3 is connected to a power source, and an output terminal of the operational amplifier A3 is connected to a gate of the NMOS transistor N1. A source of the NMOS transistor N1 is grounded via the resistance element R17. An inverting input terminal of the operational amplifier A3 is connected to a connection point between the source of the NMOS transistor N1 and the resistance element R17. A drain of the NMOS transistor N1 is connected to a drain of the PMOS transistor P1.

The power-supply voltage VCC is supplied to each source of the PMOS transistors P1 to P3. A gate of the PMOS transistor P1 is connected to the drain of the PMOS transistor P1. The respective gates of the PMOS transistors P1 to P3 is connected to each other. A drain of the PMOS transistor P2 is connected to a drain of the NMOS transistor N2. A drain of the PMOS transistor P3 is connected to one end (an upper end illustrated in FIG. 2) of the serial resistance section 20.

A gate of the NMOS transistor N2 is connected to the drain of the NMOS transistor N2. The gate of the NMOS transistor N2 is connected also to a gate of the NMOS transistor N3. Each source of the NMOS transistors N2 and N3 is grounded. A drain of the NMOS transistor N3 is connected to the other end (a lower end illustrated in FIG. 2) of the serial resistance section 20. According to the above configuration, the bias currents Ibias1 and Ibias2 flow in the serial resistance section 20.

Note that the above-described sensor signal is a signal having a ratiometric characteristic, and there is a case in which a non-ratiometric component having a non-ratiometric characteristic is superimposed on this signal, due to a variation in a process of manufacturing the sensor or the like, and the signal may become offset. In such case, a predetermined process, such as a detection process, based on the sensor signal may not be properly performed. Thus, in the first exemplary embodiment, the correction is performed such that the non-ratiometric component is removed or reduced from the sensor signal containing the non-ratiometric component by the ratiometric generation circuit 12, the ratiometric correction circuit 14, and the correction target circuit 16. Then, the signal after being subjected to the correction is output from the output terminal of the operational amplifier A2 of the correction target circuit 16. Note that the ratiometric characteristic is a characteristic that a voltage level of signal is changed in proportion to a change of power-supply voltage, and the non-ratiometric characteristic is a characteristic that the voltage level of signal is not in proportion to the change of power-supply voltage.

Next, a description will be described regarding operations of the respective circuits of the ratiometric generation circuit 12, the ratiometric correction circuit 14, and the correction target circuit 16 according to the first exemplary embodiment.

First, the switch S6 is set to ON state, and the switch S1 to S5, S7 to S11 are set to OFF states so that the above-described respective circuits and sensors are driven with a voltage value of the power-supply voltage VCC being set to a first voltage value (for example, 5 V), and each output value (hereinafter, referred to as a "first output value") of the respective correction target circuits 16 is measured. Then, the above-described respective circuits and sensors are driven with a voltage value of the power-supply voltage VCC being set to a second voltage value (for example, 5.5 V), which is higher than the first voltage value, and each output value (hereinafter, referred to as a "second output value") of the respective correction target circuits 16 is measured.

A difference between the first output value and the second output value becomes a difference between the ratiometric components of the sensor signals, which is in proportion to a change of the voltage value of the power-supply voltage VCC. Thus, each signal level of the non-ratiometric component of the sensor signal input to the respective correction target circuits 16 is obtained from the difference between the first output value and the second output value.

Next, an input voltage (hereinafter, referred to as an "ideal input voltage") which is necessary for removing a signal having the obtained signal level of the non-ratiometric component and is input to the non-inverting input terminal of the operational amplifier A2, is obtained from the obtained signal level of the non-ratiometric component. Then, any switch among the switches S1 to S11 to be set to ON state is determined, such that a voltage closest to the obtained ideal input voltage is input to the non-inverting input terminal of the operational amplifier A2. Further, a value to set the determined switch to ON state is stored in the storage area corresponding to each of the correction target circuits 16 of the correction data storing register 18.

In this manner, the above-described respective circuits and sensors are driven in a state in which one among the switches S1 to S11 is set to ON state based on the stored value of the correction data storing register 18. Accordingly, the sensor signal in which the non-ratiometric component is corrected is output from the respective correction target circuits 16.

As described above, in the semiconductor device 10 of the first exemplary embodiment, the sensor signal to be input to the plural correction target circuits 16 can be corrected by single ratiometric correction circuit 14. Not that the number of the correction target circuits 16 is not limited to two, but may be three or more.

As described above, differences in voltages output from the respective connection points a to k approximate uniformity as a difference between the bias current Ibias1 and the bias current Ibias2 becomes small. Further, it is possible to input a voltage close to the ideal input voltage to the non-inverting input terminal of the operational amplifier A2 as the differences in voltages output from the respective connection points a to k becomes close to the uniformity. Namely, it is possible to accurately correct the non-ratiometric component of the sensor signal as the difference between the bias current Ibias1 and the bias current Ibias2 becomes small. Thus, in the semiconductor device 10 according to the first exemplary embodiment, the layout of the respective elements configuring the semiconductor device 10 is defined in order to equalize the bias current Ibias1 and the bias current Ibias2.

Next, a description will be given regarding a layout of the semiconductor device 10 according to the first exemplary embodiment with reference to FIG. 3.

Figure 3:
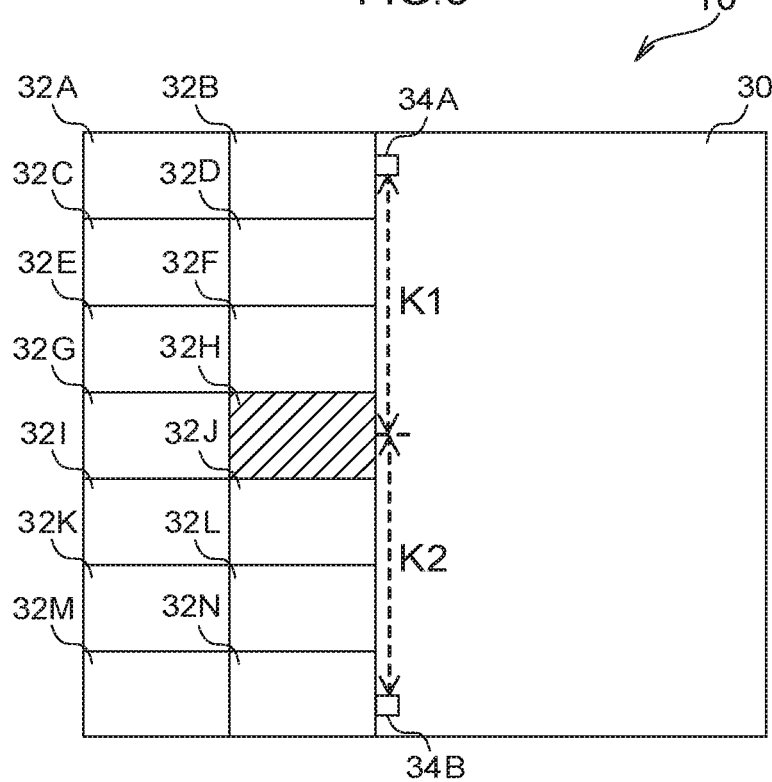
FIG. 3 is a schematic plan view that describes a layout of each configuring element of a semiconductor device according to each exemplary embodiment.

As illustrated in FIG. 3, the semiconductor device 10 according to the first exemplary embodiment has an area being divided into a serial resistance block 30 in which the serial resistance section in which the plural resistance elements are connected in series is disposed, and amplifier blocks 32A to 32N in which configuring sections including an operational amplifier are disposed.

The serial resistance section 20 is disposed in the serial resistance block 30, one end of the serial resistance section 20 is connected to a first terminal 34A, and the other end of the serial resistance section 20 is connected to a second terminal 34B. The first terminal 34A and the second terminal 34B are disposed in contact with an outer periphery of the serial resistance block 30 at an inner side of the serial resistance block 30.

The current adjustment section 22 is disposed, for example, in the amplifier block 32H (part with the oblique lines illustrated in FIG. 3), which is adjacent to the serial resistance block 30. Namely, as illustrated in FIG. 3, the current adjustment section 22 is disposed at a position at which a distance K1 along the outer periphery of the serial resistance block 30 from the first terminal 34A and a distance K2 along the outer periphery of the serial resistance block 30 from the second terminal 34B are equal. Note that the term of "equal" used here means not only completely "equal", but also a concept which includes an error that the difference between the bias current Ibias1 and the bias current Ibias2 is within a tolerance range. Due to the above, since a wiring length between the current adjustment section 22 and the first terminal 34A, and a wiring length between the current adjustment section 22 and the second terminal 34B are efficiently equalized, the bias current Ibias1 and the bias current Ibias2 may be efficiently equalized.

Figure 4:
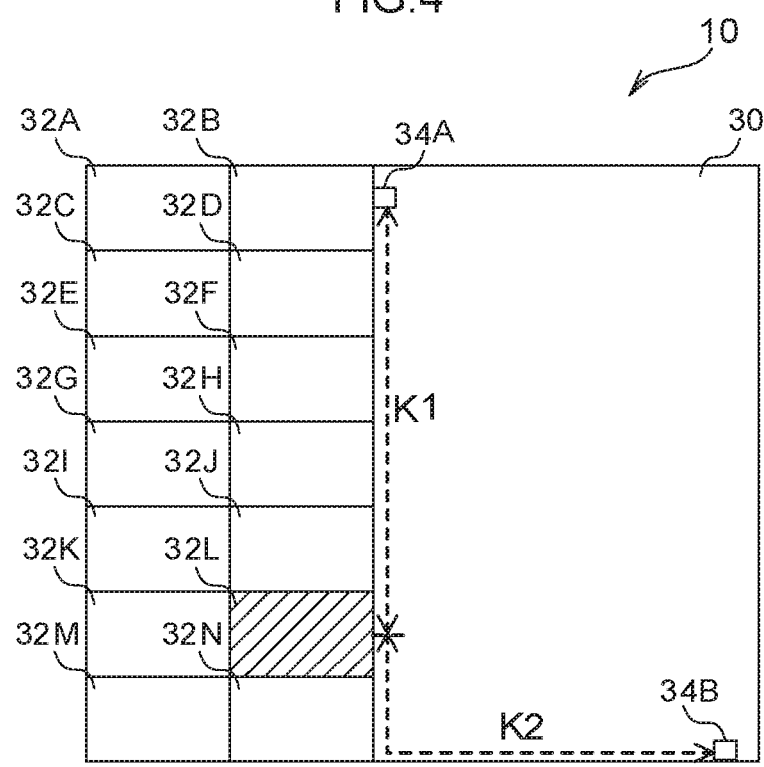
FIG. 4 is a schematic plan view that describes a modified example of the layout of each configuring element of the semiconductor device according to each exemplary embodiment.

Note that the layout of the first terminal 34A, the second terminal 34B and the current adjustment section 22 is not limited to the example illustrated in FIG. 3. For example, as illustrated in FIG. 4, the first terminal 34A may be disposed in contact with a side (left side in FIG. 4) of the outer periphery of the serial resistance block 30, and the second terminal 34B may be disposed in contact with a side (lower side in FIG. 4) that contacts with the above-described side of the serial resistance block 30. In such case, the current adjustment section 22 may be disposed in the amplifier block 32L. Namely, another layout may be possible as long as the distance K1 along the outer periphery of the serial resistance block 30 between the first terminal 34A and the current adjustment section 22 and the distance K2 along the outer periphery of the serial resistance block 30 between the second terminal 34B and the current adjustment section 22 are equal.

Further, the ratiometric generation circuit 12 is disposed in the amplifier block 32J, the correction target circuits 16A and 16B are disposed respectively in the amplifier blocks 32D and 32F, for example, in the first exemplary embodiment.

Meanwhile, in the case of correcting the non-ratiometric component of the sensor signal, there may be a case in which the signal is offset by the non-ratiometric component superimposed on a signal flowing to each circuit, due to the variation in a process of manufacturing the respective operational amplifiers A1 to A3.

Accordingly, in the semiconductor device 10 according to the first exemplary embodiment, the respective operational amplifiers A1 to A3 have the same configuring elements, and are disposed in the same direction with respect to the corresponding amplifier blocks, in order to reduce a difference of the offset caused by the variation in each of the operational amplifiers A1 to A3. To be more specific, each arrangement and each connection of the elements configuring the operational amplifiers A1 to A3 are formed to be the same. Note that the term of the "same" used here means not only completely the same, but also a concept which includes an error caused in a manufacturing process or the like.

Figure 5:
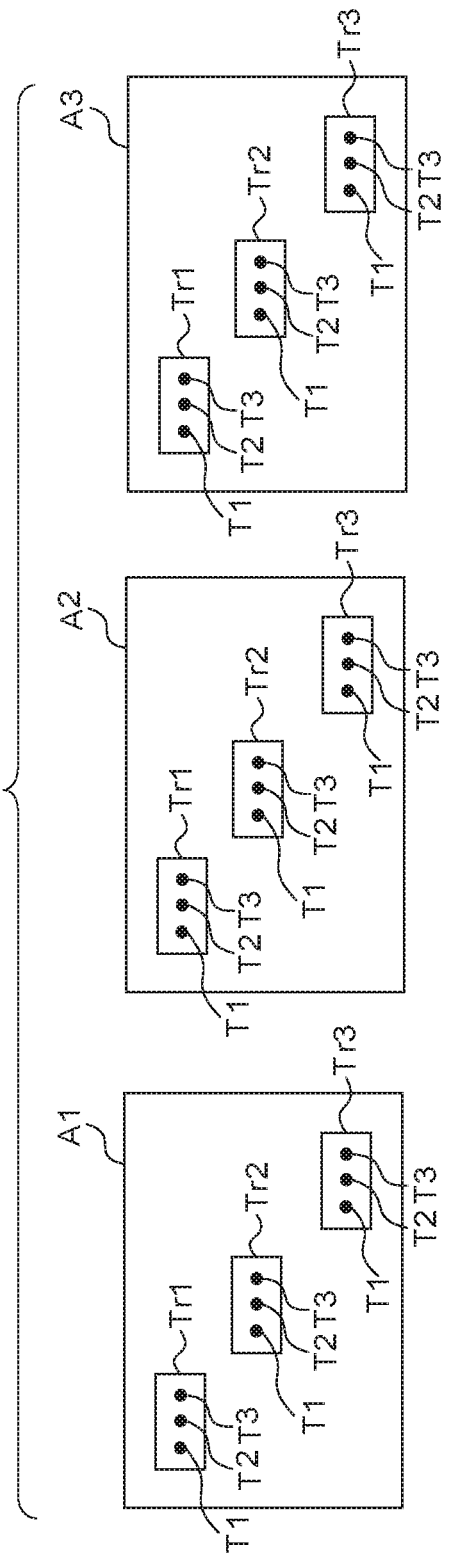
FIG. 5 is a schematic plan view that describes an arrangement of elements configuring an operational amplifier according to each exemplary embodiment.

A description will be given regarding the arrangement of elements configuring the operational amplifiers A1 to A3 with reference to FIG. 5. As illustrated in FIG. 5, for example, in a case in which the operational amplifiers A1 to A3 have transistors Tr1 to Tr3 as elements configuring the operational amplifiers A1 to A3, the corresponding transistors Tr1 to Tr3 of the operational amplifiers A1 to A3 are disposed at the same positions in the operational amplifiers A1 to A3. Further, the corresponding transistors Tr1 to Tr3 of the operational amplifiers A1 to A3 are disposed in the same direction in the same connection state in the first exemplary embodiment.

The term "same direction", used here, means that terminals T1 to T3 of the corresponding transistors Tr1 to Tr3 of the operational amplifiers A1 to A3 are disposed at the same positions, respectively, in the operational amplifiers A1 to A3, for example. In this manner, the operational amplifiers A1 to A3 are disposed in the same directions in the respective amplifier blocks in which the respective operational amplifiers A1 to A3 are disposed, and thus, it is possible to reduce the difference of the offset caused by the variation in each of the operational amplifiers A1 to A3. Note that the arrangement positions of the operational amplifiers A1 to A3 in the respective amplifier blocks may be the same or may be different from each other.

Second Exemplary Embodiment

First, a description will be given regarding a circuit configuration of the semiconductor device 10 according to a second exemplary embodiment with reference to FIG. 6. Note that, in FIG. 6, elements that have the same functions as those in FIG. 1 will be attached with the same reference numerals, and the description thereof will be omitted.

Figure 6:
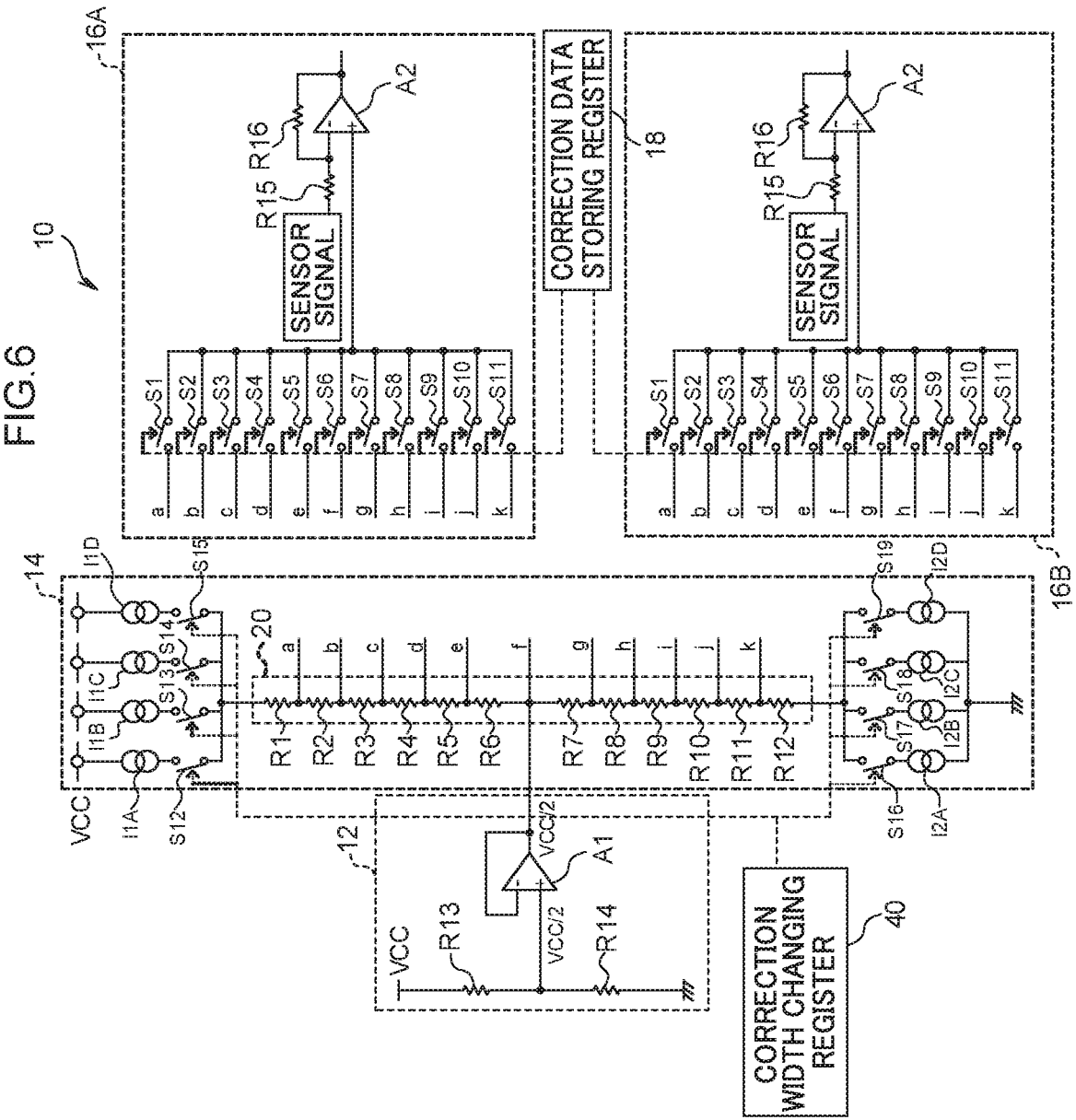
FIG. 6 is a circuit diagram illustrating a main configuration of a circuit provided in the semiconductor device according to the second exemplary embodiment.

As illustrated in FIG. 6, the ratiometric correction circuit 14 according to the second exemplary embodiment includes constant-current sources I1A to I1D and I2A to I2D, switches S12 to S19, and a correction width changing register 40. The constant-current source I1A to I1D are discharge type constant-current sources similarly to the constant-current source I1 of the first exemplary embodiment. Further, each of the constant-current sources I1A to I1D has one end to which the power-supply voltage VCC is supplied, and the other end being connected to one end of the serial resistance section 20 via each of the switches S12 to S15. Further, the respective constant-current sources I1A to I1D are set to cause currents having different magnitudes to flow in the second exemplary embodiment.

The constant-current source I2A to I2D are sink type constant-current sources similarly to the constant-current source I2 of the first exemplary embodiment. Further, each of the constant-current source I2A to I2D has one end being connected to the other end of the serial resistance section 20 via each of the corresponding switches S16 to S19, and the other end being grounded. Further, the constant-current source I2A to I2D have one-to-one correspondence with the constant-current sources I1A to I1D, respectively, and are set to cause current, which has the same magnitude with the corresponding constant-current sources I1A to I1D to flow. Further, each of the switches S12 to S15 and each of the switches S16 to S19 has one-to-one correspondence, and each ON/OFF state of the corresponding switches (for example, the switch S12 and the switch S16) is the same.

The correction width changing register 40 is provided with a storage area, and each ON/OFF state of the switches S12 to S15 and the corresponding switches S16 to S19 is changed based on a digital signal to be output according to a value stored in the storage area Next, a description regarding operations of the respective circuits of the ratiometric generation circuit 12, the ratiometric correction circuit 14, and the correction target circuit 16 according to the second exemplary embodiment will be described.

First, the switches S12 and S16 are set to ON states, the switches S13 to S15 and S17 to S19 are set to OFF states, and a first output value and a second output value are measured in the same manner as in the first exemplary embodiment.

Next, an ideal input voltage is obtained based on a difference between the first output value and the second output value similarly to the first exemplary embodiment. Then, a pair of a switch among the switches S1 to S11 and a switch among the switches S12 to S19 to be set to ON state is determined, such that a voltage closest to the obtained ideal input voltage is input to the non-inverting input terminal of the operational amplifier A2. Further, each value to set the determined switches to ON states is stored in the storage area corresponding to each of the correction target circuits 16 of the correction data storing register 18, and the storage area of the correction width changing register 40.

In this manner, the above-described respective circuits and sensors are driven in a state in which the pair of any switch among the switches S1 to S11 and any switch among the switches S12 to S19 is set to ON state based on the stored values of the correction data storing register 18 and the correction width changing register 40. Accordingly, the sensor signal in which the non-ratiometric component is corrected is output from the respective correction target circuits 16.

As described above, in the semiconductor device 10 according to the second exemplary embodiment, each potential difference among the connection points a to k may be set minutely with more steps numbers, as compared to the first exemplary embodiment. As a result, the semiconductor device 10 according to the second exemplary embodiment may select a voltage far closer to the ideal input voltage, and may more accurately correct the sensor signal.

Note that, there may be a case in which each ideal input voltage obtained for each of the plural correction target circuits 16 are greatly different, and a combination of the switches S12 to S19 to be set to ON state in correspondence with the voltage closest to each ideal input voltage becomes different. In such case, for example, it is considered that a combination of the switches S12 to S19, which corresponds to a large ideal input voltage, is set to ON state. In such case, there may be cases in which the sensor signal is not accurately corrected in the correction target circuit 16 with a small ideal input voltage.

With respect to this, in the present disclosure as described above, the elements configuring the operational amplifiers A1 to A3 have the same arrangement, and thus, the difference of the offset caused by the variation of the operational amplifiers A1 to A3 is reduced as compared to a case in which the elements configuring the operational amplifiers A1 to A3 are disposed in different states. Therefore, the semiconductor device 10 according to the second exemplary embodiment may accurately correct the sensor signal to be input to the respective correction target circuits 16 as a result of reducing the difference in the ideal input voltages of the respective correction target circuits 16 as compared to a case in which the elements configuring the operational amplifiers A1 to A3 are disposed in different states.

Third Exemplary Embodiment

First, a description will be given regarding a circuit configuration of the semiconductor device 10 according to a third exemplary embodiment with reference to FIG. 7. Note that, in FIG. 7, elements that have the same functions as those in FIG. 6 will be attached with the same reference numerals, and the description thereof will be omitted.

Figure 7:
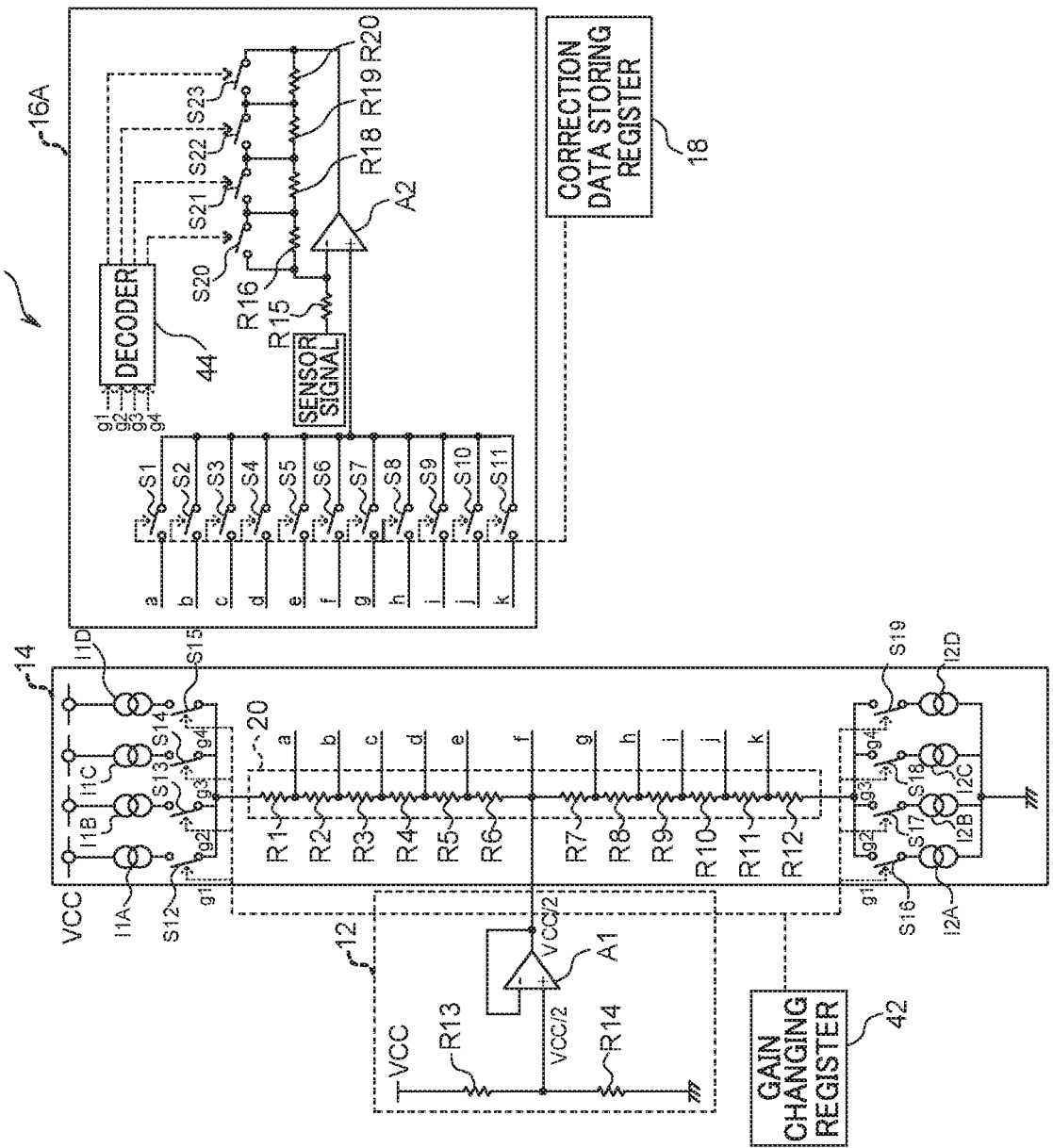
FIG. 7 is a circuit diagram illustrating a main configuration of a circuit provided in the semiconductor device according to the third exemplary embodiment.
Figure 8:
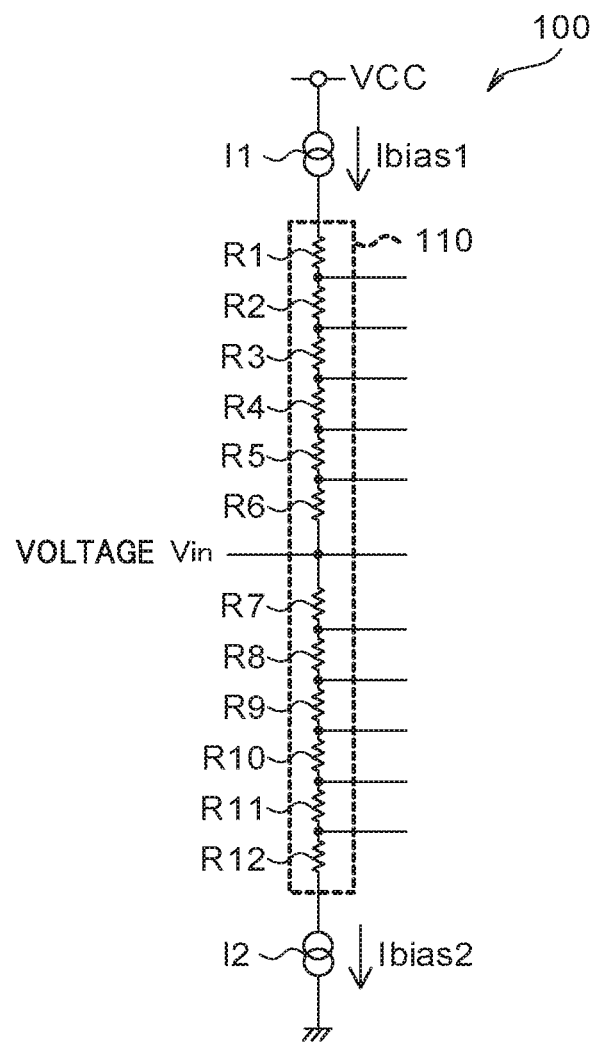
FIG. 8 is a circuit diagram illustrating a main configuration of a conventional resistance voltage dividing circuit.

As illustrated in FIG. 7, the correction target circuit 16A according to the third exemplary embodiment includes resistance elements R18 to R20, switches S20 to S23, a gain changing register 42, and a decoder 44. The resistance elements R16 and R18 to R20 are connected in series. The switches S20 to S23 are provided in correspondence with the respective resistance elements R16 and R18 to R20, and are connected in series. Both ends of each of the switches S20 to S23 connected in series, are connected to both ends of each of the resistance elements R16 and R18 to R20 connected in series. Each connection point among the switches S20 to S23 is connected to each connection point among the corresponding resistance elements R16 and R18 to R20. Namely, an amplification rate (gain) of the operational amplifier A2 is changed depending on each ON/OFF state of the switches S20 to S23.

The gain changing register 42 is provided with a storage area, and each ON/OFF state of the switches S12 to S15 and the corresponding switches S16 to S19 is changed based on digital signals g1 to g4 to be output according to a value stored in the storage area. Further, the digital signals g1 to g4 are input to the decoder 44, and each ON/OFF state of the switches S20 to S23 is changed by the signal decoded by the decoder 44.

The third exemplary embodiment is configured such that each magnitude of the bias current Ibias1 and the bias current Ibias2 is changed depending on the amplification rate of the operational amplifier A2. As an example, a description will be given regarding a case in which each resistance value of the resistance elements R15 and R16 is set to r, a resistance value of resistance element R18 is set to 2×r, a resistance value of the resistance element R19 is set to 4×r, and a resistance value of the resistance element R20 is set to 8×r. Further, as the example, the description will be given regarding a case in which a current amount discharged by the constant-current source I1A and a current amount sunk by the constant-current source I2A are set to Iref, and a current amount discharged by the constant-current source I1B and a current amount sunk by the constant-current source I2B are set to 2×Iref. Furthermore, as the example, the description will be given regarding a case in which a current amount discharged by the constant-current source I1C and a current amount sunk by constant-current source I2C are set to 4×Iref, and a current amount discharged by the constant-current source I1D and a current amount sunk by the constant-current source I2D are set to 8×Iref.

For example, the switches S20 to S22 are set to ON states, and the switch S23 is set to OFF state in a case in which the amplification rate of the operational amplifier A2 is set to 8 times. Further, the switches S12 to S14 and S16 to S18 are set to OFF states, and the switches S15 and S19 are set to ON states in this case.

Operations of respective circuits including the ratiometric generation circuit 12, the ratiometric correction circuit 14, and the correction target circuit 16 according to the third exemplary embodiment other than the above-described point are the same as those in the first exemplary embodiment and the second exemplary embodiment, and thus, the description thereof will be omitted.

In a case in which the amplification rate of the operational amplifier A2 is set to a value that exceeds 1 time, namely, an offset voltage input to the non-inverting input terminal of the operational amplifier A2×an error of the amplification rate is output from the output terminal of the operational amplifier A2. Accordingly, in such case, the correction of the sensor signal may not be accurately performed. On the contrary, each magnitude of the bias current Ibias1 and the bias current Ibias2 is changed in proportion to the amplification rate of the operational amplifier A2 in the third exemplary embodiment. Accordingly, each potential difference among the respective connection points a to k is changed in proportion to the amplification rate of the operational amplifier A2. Accordingly, the present exemplary embodiment may accurately correct the sensor signal.

Although FIG. 7 illustrates a case in which the single correction target circuit 16 is provided, the plural correction target circuits 16 may be provided as long as the amplification rate of the operational amplifier A2 is the same value. Further, the correction target circuit 16 of the first exemplary embodiment and the second exemplary embodiment may be provided further to the correction target circuit 16 of the third exemplary embodiment.

What is claimed is:
1. A semiconductor device comprising:
 a resistance block, formed on the semiconductor device, that includes a serial resistance section in which a plurality of resistance elements are connected in series; and a current adjustment block, formed on the semiconductor device at an area different from an area on which the resistance block is formed, that includes a current source that supplies current to the serial resistance section, and that is disposed at a position in which a distance between one end of the serial resistance section and the current adjustment block along an outer periphery of the resistance block is equal to a distance between another end of the serial resistance section and the current adjustment block along the outer periphery of the resistance block, wherein the resistance block includes a first terminal connected to the one end of the serial resistance section and a second terminal connected to the another end of the serial resistance section, and the first terminal and the second terminal are disposed in contact with the outer periphery of the resistance block, and wherein one end of the current source is connected to the first terminal via a first wiring, another end of the current source is connected to the second terminal via a second wiring, and a wiring length of the first wiring and a wiring length of the second wiring are equal.

2. The semiconductor device according to claim 1, wherein the current adjustment block is disposed adjacent to the resistance block.

3. The semiconductor device according to claim 1, further comprising a ratiometric generation circuit that includes a first operational amplifier and outputs a signal in which a voltage level is changed according to a change of a power-supply voltage, wherein an output terminal of the ratiometric generation circuit is connected to a predetermined connection point out of connection points of the plurality of resistance elements connected in series.

4. The semiconductor device according to claim 3, wherein:

the current adjustment block includes a second operational amplifier; and each arrangement of elements configuring the first operational amplifier and the second operational amplifier are set to be the same.

5. The semiconductor device according to claim 4, further comprising a correction target circuit that includes a third operational amplifier in which one of a non-inverting input terminal or an inverting input terminal is connected to each of the connection points of the plurality of resistance elements connected in series, that is input with an input signal in which a voltage level is changed according to the change of the power-supply voltage from another one of the non-inverting input terminal or the inverting input terminal, and that outputs a signal in which a component having a non-ratiometric characteristic superimposed on the input signal is corrected, wherein the current adjustment block, the ratiometric generation circuit, and the correction target circuit are disposed in an area different from an area in which the resistance block is disposed.

6. The semiconductor device according to claim 5, wherein each of the current adjustment block, the ratiometric generation circuit, and the correction target circuit is disposed in an area which is adjacent to the area in which the resistance block is disposed.

7. The semiconductor device according to claim 5, wherein each arrangement of elements configuring the first operational amplifier, the second operational amplifier, and the third operational amplifier are set to be the same.

* * * * *